United States Patent [19]
Tsai et al.

[11] Patent Number: 6,157,266
[45] Date of Patent: Dec. 5, 2000

[54] DELAY ELEMENTS ARRANGED FOR A SIGNAL CONTROLLED OSCILLATOR

[75] Inventors: Li Ching Tsai; Johnny Q. Zhang; David B. Hollenbeck, all of Ft. Collins, Colo.

[73] Assignee: Hewlett-Packard Company, Palo Alto, Calif.

[21] Appl. No.: 09/022,464

[22] Filed: Feb. 12, 1998

[51] Int. Cl.$^7$ .................................................. H03B 5/24
[52] U.S. Cl. .................. 331/57; 331/177 R; 327/280; 327/281
[58] Field of Search ................. 331/57, 177 R; 327/280, 281

[56] References Cited

U.S. PATENT DOCUMENTS

| | | | |
|---|---|---|---|
| 5,061,907 | 10/1991 | Rasmussen | 331/57 |
| 5,136,260 | 8/1992 | Yousefi-Elezei | 331/17 |
| 5,262,735 | 11/1993 | Hashimoto et al. | 331/45 |
| 5,285,173 | 2/1994 | Reynolds | 331/57 |
| 5,331,295 | 7/1994 | Jelinek et al. | 331/57 |
| 5,477,182 | 12/1995 | Huizer | 327/261 |
| 5,495,207 | 2/1996 | Novof | 331/57 |
| 5,568,103 | 10/1996 | Nakashima et al. | 331/185 |
| 5,596,610 | 1/1997 | Leung et al. | 375/376 |
| 5,673,008 | 9/1997 | Sumita | 331/57 |
| 5,682,123 | 10/1997 | Chau | 331/57 |
| 5,694,090 | 12/1997 | Morgan | 331/57 |
| 5,703,541 | 12/1997 | Nakashima | 331/57 |
| 5,714,912 | 2/1998 | Fiedler et al. | 331/57 |
| 5,767,748 | 6/1998 | Nakao | 331/57 |

OTHER PUBLICATIONS

"Analysis, Modeling, And Simulation Of Phase Noise In Monolithic Voltage–Controlled Oscillators", author Behzad Razavi, AT&T Bell Laboratories, Holmdel, NJ 07733, Publication date Jan. 5, 1995; Proceedings of the Custom Integrated Circuits Conference, Santa Clara, No. Conf. 17, May 1–4, 1995, pp. 323–326.

*Primary Examiner*—Arnold Kinkead
*Attorney, Agent, or Firm*—Jack A. Lenell

[57] ABSTRACT

A ring-type signal controlled oscillator comprising a series of active delay elements, each including a respective differential pair of transistors. The inputs and outputs of the differential pair transistors are interconnected in a closed ring to produce oscillations at a frequency determined by the delay of each delay element. The differential pair of transistors further has a pair of current source inputs for controlling an amount of delay of the delay element, and a pair of load inputs for stabilizing the amount of delay. The invention advantageously provides high frequency operation with substantially symmetric rise and fall time, while limiting spread in oscillation frequency and spread in amplitude in relation to fabrication process variability and power supply variability.

7 Claims, 5 Drawing Sheets

DELAY ELEMENTS ARRANGED FOR A SIGNAL CONTROLLED OSCILLATOR

FIELD OF THE INVENTION

The invention generally relates to oscillators of the type having a number of delay elements interconnected in a closed ring, and more particularly relates to such oscillators wherein the delay is controlled by a signal so as to vary the frequency of oscillation.

BACKGROUND OF THE INVENTION

Various ring oscillator are known in the prior art. Inverters are used as delay elements and are interconnected in a closed ring. An amount of delay of each delay element is controlled by controlling a flow of current available for charging of parasitic capacitance associated with each inverter.

Ring oscillator design presents various challenges. Some oscillator designs of the prior art have limited high frequency operation. Some other oscillator designs have an oscillation frequency or amplitude that vary over a wide spread in relation to variability in a process used in fabricating such oscillators. Still other oscillator designs have substantial sensitivity to power supply variability and have asymmetric rise and fall times.

What is needed in a ring oscillator that provides high frequency operation, substantially symmetric rise and fall time, while limiting spread in oscillation frequency and spread in amplitude in relation to fabrication process variability and power supply variability.

SUMMARY OF THE INVENTION

The oscillator of the invention provides high frequency operation with substantially symmetric rise and fall time, while limiting spread in oscillation frequency and spread in amplitude in relation to fabrication process variability and power supply variability.

Briefly and in general terms, the invention includes a ring-type signal controlled oscillator comprising a series of active delay elements, each including a respective differential pair of transistors. The inputs and outputs of the differential pair transistors are interconnected in a closed ring to produce oscillations at a frequency determined by the delay of each delay element. The differential pair of transistors further has a pair of current source inputs for controlling an amount of delay of the delay element, and a pair of load inputs for stabilizing the amount of delay.

For the active delay element, a first and a second signal controlled current source are each coupled with a respective one of the current source inputs of the differential pair of transistors. The first signal controlled current source is adapted for receiving a first control signal for controlling the first signal controlled current source. The second signal controlled current source is adapted for receiving a first bias signal for controlling the second signal controlled current source. These current sources are "matching" in that transistors of the first and second signal controlled current source are similarly configured in a matching arrangement of transistors of the same type.

Furthermore, the delay element includes a first and a second signal controlled active load, each coupled with a respective one of the load inputs of the differential pair of transistors. The first and second signal controlled active loads are adapted for receiving a second control signal and a second bias signal.

Other aspects and advantages of the present invention will become apparent from the following detailed description, taken in conjunction with the accompanying drawings, illustrating by way of example the principles of the invention.

DETAILED DESCRIPTION OF PREFERRED EMBODIMENT

Figure 1A:
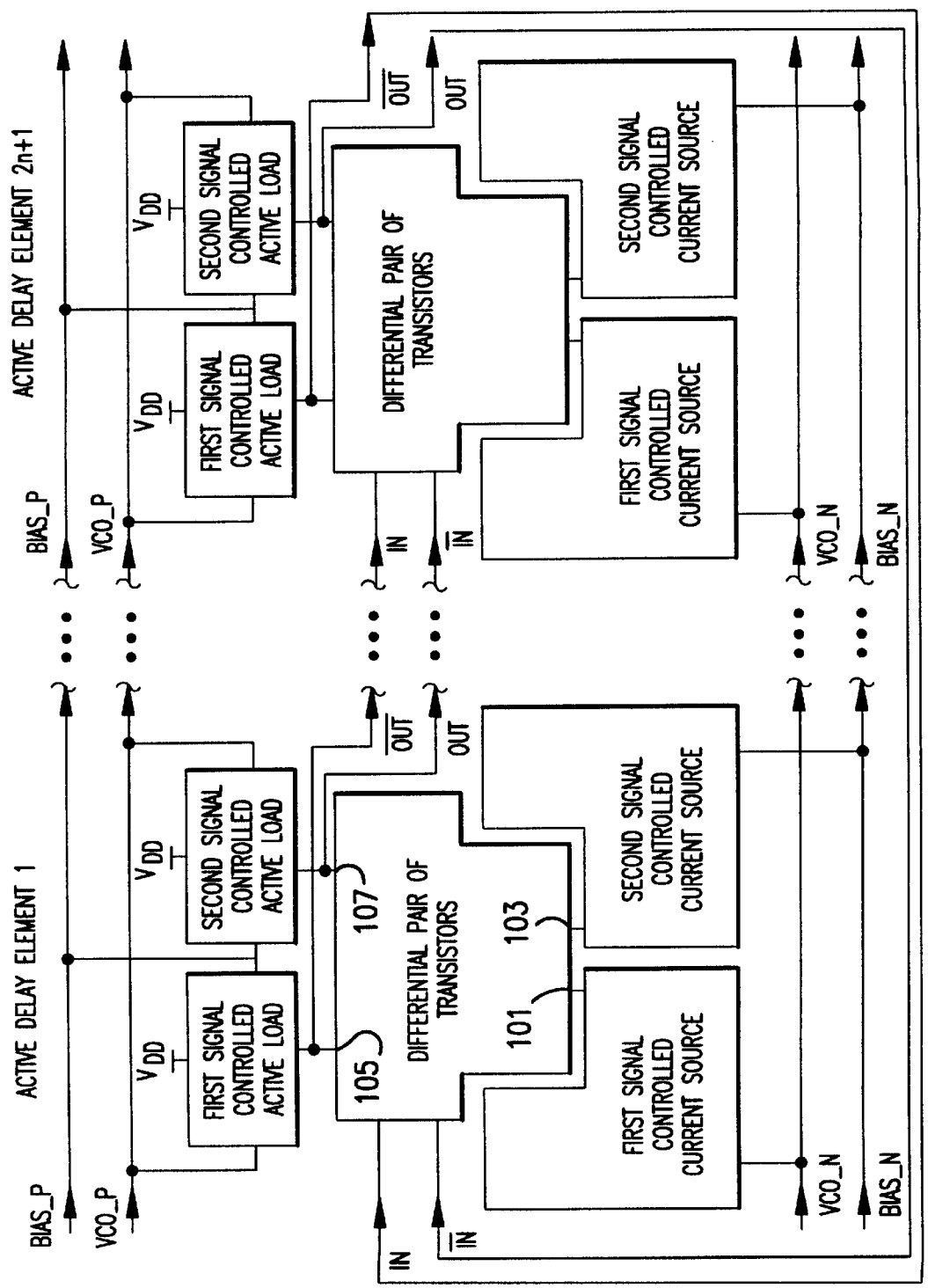
FIG. 1A is a block diagram of a preferred embodiment of the invention.

FIG. 1A shows a block diagram of a preferred embodiment of the invention. the invention includes a ring-type signal controlled oscillator comprising a series of active delay elements, each including a respective differential pair of source coupled transistors. As shown in FIG. 1A an odd number of active delay elements are used in the preferred embodiment, beginning with Active Delay Element 1, and ending with Active Delay element 2n+1. A preferred number of active delay elements is three to seven active delay elements.

As shown in FIG. 1A, each differential pair of transistors has both inverting and non-inverting types of delay inputs and outputs: In, $\overline{\text{In}}$, Out, and $\overline{\text{Out}}$. The inputs and outputs of the differential pair of transistors are interconnected, as shown, in a closed ring to produce oscillations at a frequency determined by the delay of each delay element. As shown, each differential pair of source coupled transistors has a pair of current source inputs 101, 103, and further has a pair of load inputs 105, 107.

For the active delay element, a first and a second signal controlled current source are each coupled with a respective one of the current source inputs 101, 103 of the differential pair of source coupled transistors. The first signal controlled current source is adapted for receiving a first control signal VCO_N for controlling the first signal controlled current source. Furthermore, as will be discussed in further detail subsequently herein, the invention advantageously includes both the first and second control signals, so that adjustment of the first and second control signals in relation to each other provides the beneficial rise and fall time symmetry of the oscillator.

The second signal controlled current source is adapted for receiving a first bias signal, bias_N, for controlling the second signal controlled current source. As will be discussed in further detail subsequently herein, the invention advantageously includes both the first and second bias signals, to advantageously limit spread in oscillation frequency and spread in amplitude of the oscillator in relation to fabrication process variability and power supply variability.

In the preferred embodiment the first and second bias signals are both used, and are held substantially constant by coupling with a current mirror (not shown in the figures). In the preferred embodiment the current mirror and all of the components of the oscillator are fabricated on a single monolithic semiconductor substrate, using integrated circuit fabrication techniques. Accordingly manufacturing process variability of the current mirror tracks manufacturing process variability of the other components of the oscillator.

Furthermore, the delay element includes a first and a second signal controlled active load, each coupled with a respective one of the load inputs of the differential pair of source coupled transistors. As shown in FIG. 1A, the first and second signal controlled active loads are adapted for receiving the second control signal, VCO_P, and the second bias signal, bias_P.

Figure 1B:
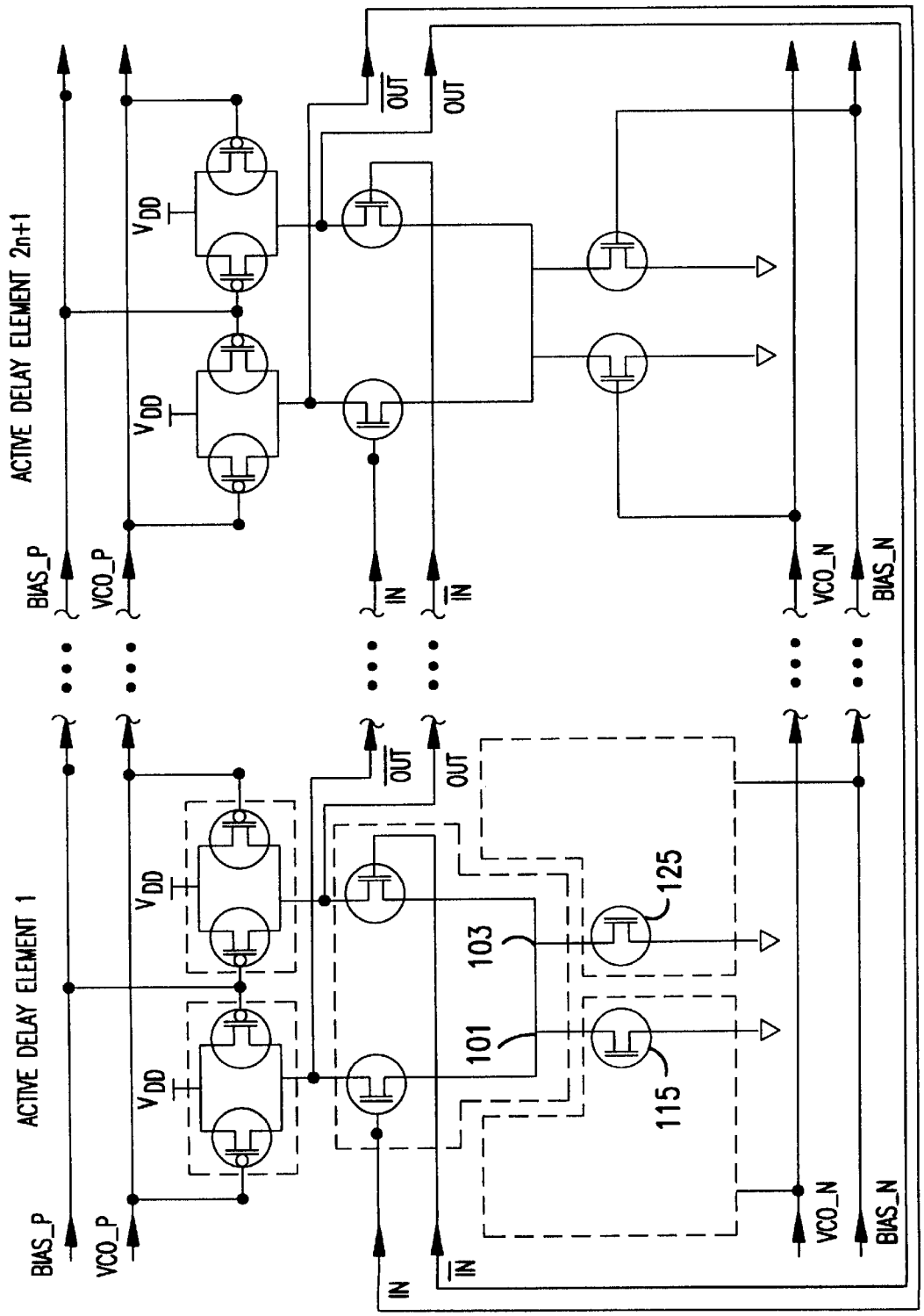
FIG. 1B is a more detailed diagram of the preferred embodiment of the invention.

FIG. 1B shows a more detailed diagram of the preferred embodiment of the invention. Dashed lines in FIG. 1B designate the functional blocks as discussed previously herein with respect to FIG. 1A. In the preferred embodiment, the first signal controlled current source includes a transistor 115 having a drain coupled with one of the current source inputs 101 of the differential pair of source coupled transistors. Transistor 115 is preferably an N type MOSFET having a gate coupled with the first control signal, VCO_N. Accordingly, in the preferred embodiment, the first control signal, VCO_N, is used to control the N-type of MOSFET As shown in FIG. 1B, the first and second current sources are "matching"in that transistors of the first and second signal controlled current source are similarly configured in a matching arrangement of transistors of the same type. In particular, in the preferred embodiment the first and second signal controlled both include N-type MOSFETs.

Just as in the first signal controlled current source, the second signal controlled current source includes a transistor 125 having a drain coupled with the second one of the current source inputs 103 of the differential pair of source coupled transistors. Transistor 125 has a gate coupled with the first bias signal, bias_N. The first bias signal, bias_N, is used to stabilize operation of the N-type of MOSFET over manufacturing variability of the oscillator.

In the preferred embodiment, the first signal controlled active load comprises a pair of drain coupled transistors, wherein one member of the pair has a gate coupled with the second control signal, VCO_P, and the other member has a gate coupled with the second bias signal, bias_P. Similarly, the second signal controlled active load comprises another pair of drain coupled transistors, wherein one member of the pair has a gate coupled with the second control signal, VCO_P, and the other member of the pair has a gate coupled with the second bias signal, bias_P. The transistors of the first and second signal controlled active loads are all of the same type, and preferably are P-type MOSFETs. Accordingly, in the preferred embodiment, the second control signal, VCO_P, controls the P-type of MOSFET. The second bias signal, bias_P, stabilizes operation of the P-type of MOSFET over manufacturing variability of the oscillator.

Figure 1C:
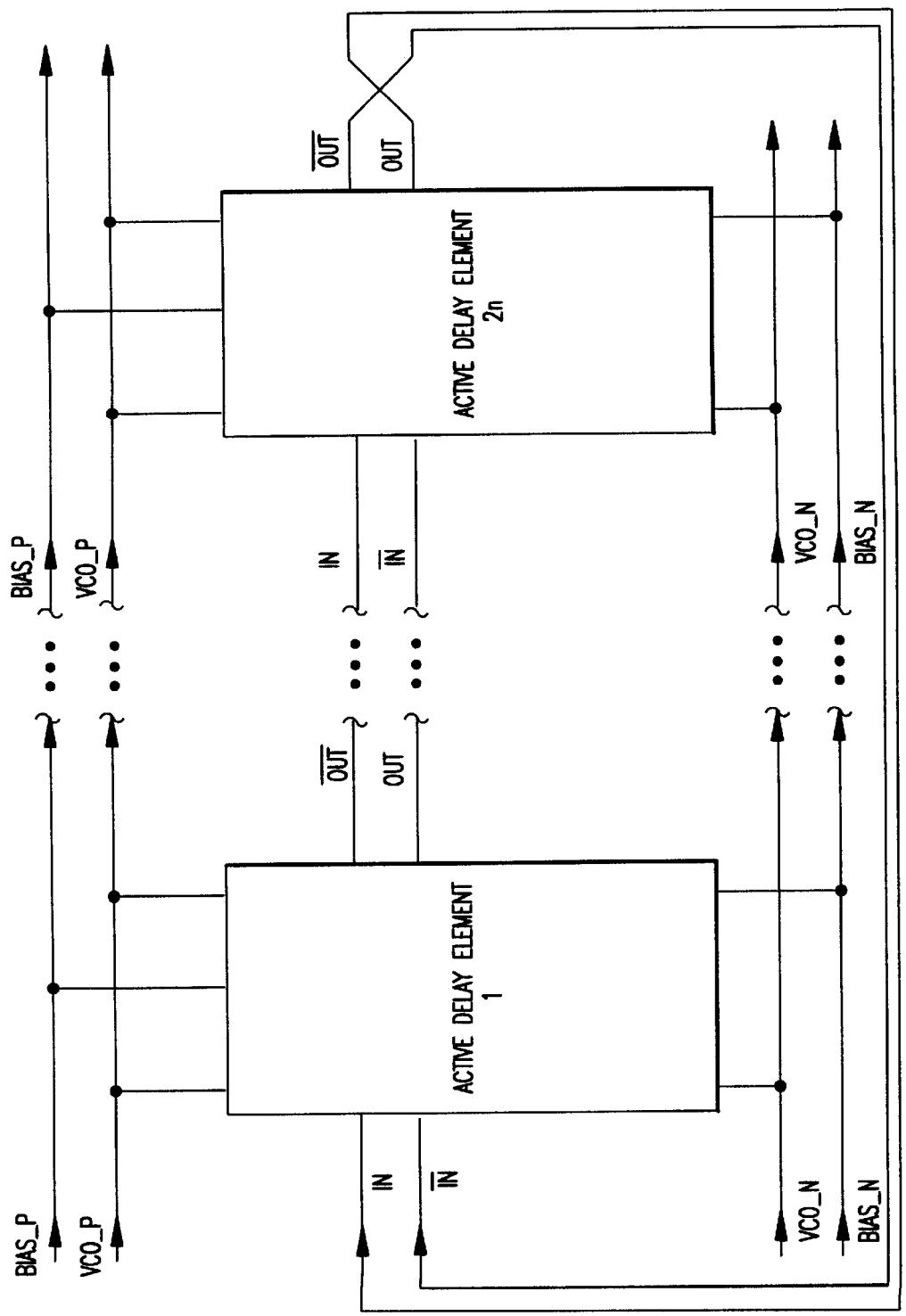
FIG. 1C is a block diagram of an alternative embodiment of the invention.

The invention is not limited to an oscillator using an odd number of active delay elements. As shown in an alternative embodiment in FIG. 1C, an even number of active delay elements are used, beginning with Active Delay Element 1, and ending with Active Delay Element 2n. A preferred number of active delay elements for the alternative embodiment is two to six active delay elements. It is particularly worth noting the reversed arrangement of outputs, Out, and $\overline{\text{Out}}$, of the last Active Delay Element 2n, for providing oscillation of the even number of active delay elements.

Figure 2:
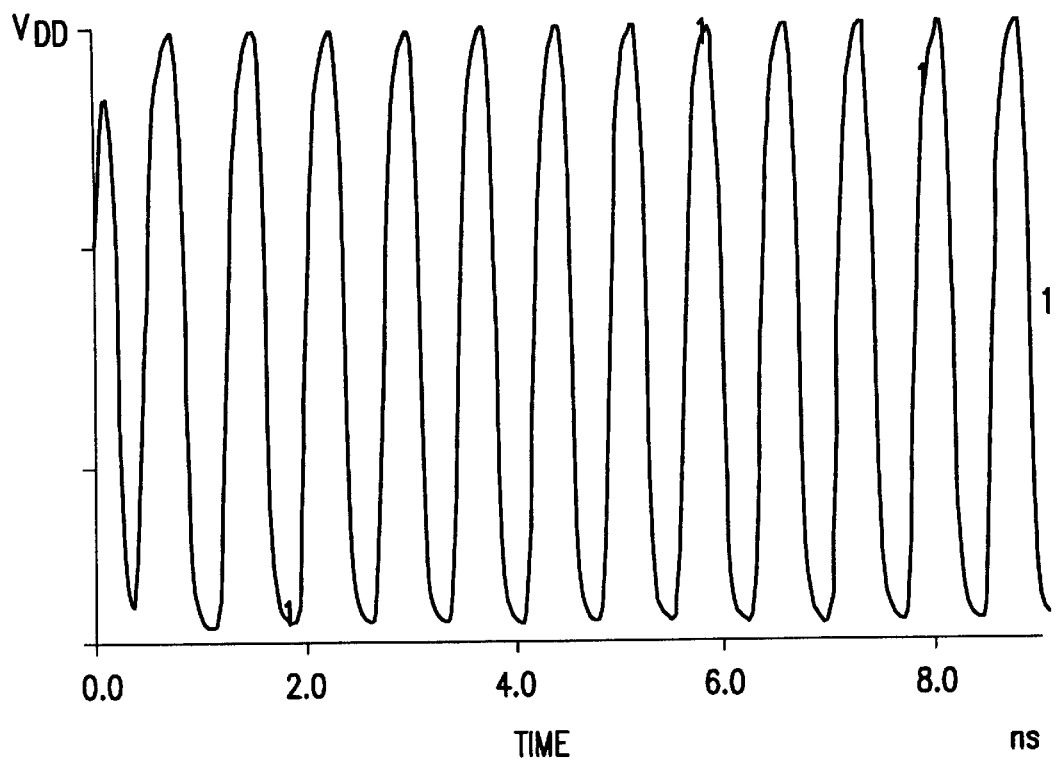
FIG. 2 is a diagram illustrating symmetric rise and fall time of oscillations of the invention.

FIG. 2 is a diagram illustrating symmetric rise and fall time of high frequency oscillations of the invention, as predicted by simulation. A horizontal axis of FIG. 2 shows time in nanoseconds. A vertical axis of FIG. 2 shows amplitude that is normalized based on supply voltage, $V_{DD}$. As pointed out previously herein, and as illustrated by FIG. 2, the invention advantageously includes both the first and second control signals, VCO_N and VCO_P, so that adjustment of the first and second control signals in relation to each other provides the beneficial rise and fall time symmetry of the oscillator.

Varying the first and second control signals varies the amount of delay of each delay element, thereby varying frequency of the oscillator. Coarse adjustment of both the first and second control signals together is used to control oscillation frequency of the oscillator. Refined adjustment of the first and second control signals in relation to each other is used to control symmetry of rise and fall times of the oscillation of the oscillator.

Figure 3:
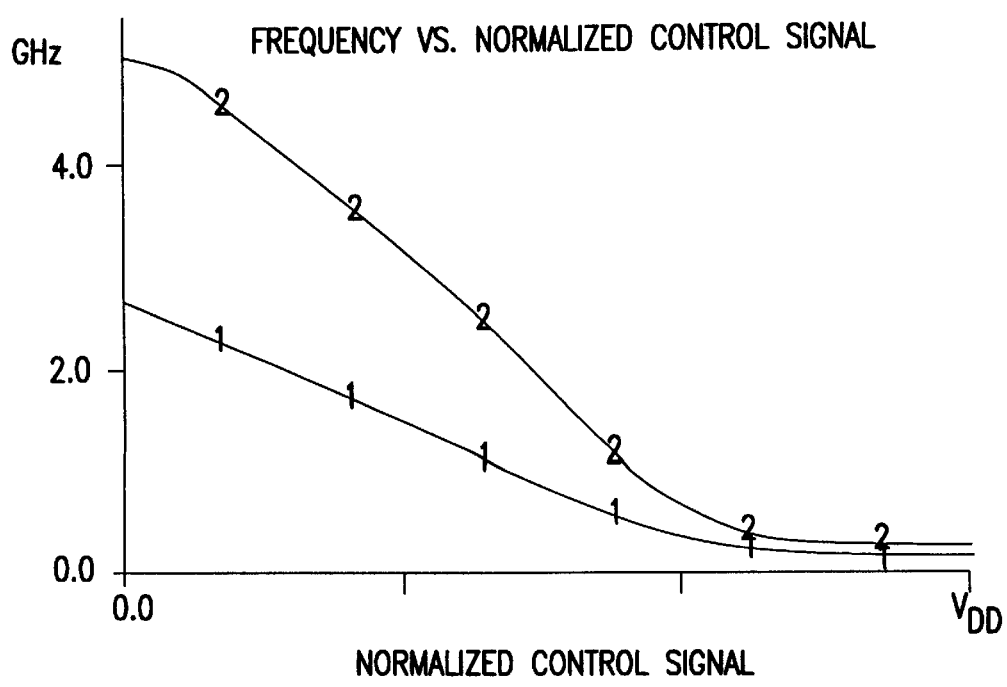
FIG. 3 is a diagram illustrating the invention's limited spread in oscillation frequency in relation to fabrication process variability.

FIG. 3 is a diagram illustrating the invention's limited spread in oscillation frequency in relation to fabrication process variability. A horizontal axis of FIG. 3 shows values for one of the control signals, on a scale normalized to the supply voltage, $V_{DD}$. A vertical axis of FIG. 3 shows corresponding frequency of oscillation of the invention in Gigahertz as predicted by simulation. A first trace of FIG. 3, trace 1, shows simulation prediction of frequency versus normalized control signal when fabrication process variability factors slow down oscillation frequency. A second trace of FIG. 3, trace 2, shows simulation prediction of frequency versus normalized signal when manufacturing process variability factors speed up oscillation frequency. As pointed out previously herein, and as illustrated by FIG. 3, the invention advantageously includes both the first and second bias signals, to advantageously limit spread in oscillation frequency of the oscillator in relation to fabrication process variability. Similarly, the first and second bias signals also advantageously limit spread in amplitude of the oscillator in relation to fabrication process variability.

Figure 4:
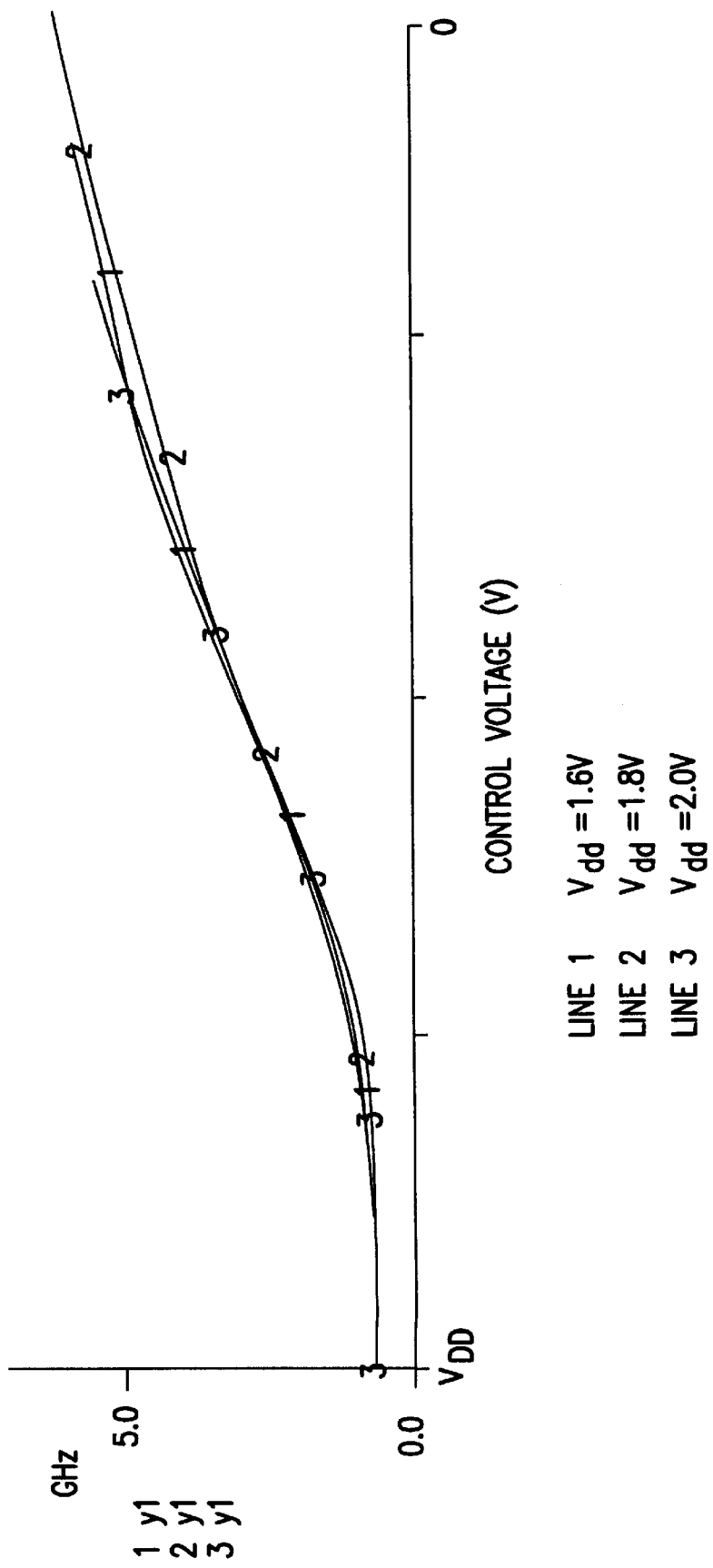
FIG. 4 is a diagram illustrating the invention's limited spread in oscillation frequency in relation to power supply variability.

FIG. 4 is a diagram illustrating the invention's limited spread in oscillation frequency in relation to power supply variability. A horizontal axis of FIG. 4 shows values for one of the control signals, on a scale normalized to the supply voltage, $V_{DD}$. A vertical axis of FIG. 4 shows corresponding frequency of oscillation of the invention in Gigahertz as predicted by simulation. A first trace of FIG. 4, trace 1, shows simulation prediction of frequency versus normalized control signal for power supply voltage, $V_{DD}$, at a low supply value of 1.6 volts. A second trace of FIG. 4, trace 2, shows simulation prediction of frequency versus normalized control signal for power supply voltage, $V_{DD}$, at a nominal supply value of 1.8 volts. A third trace of FIG. 4, trace 3, shows simulation prediction of frequency versus normalized control signal for power supply voltage, $V_{DD,}$ at a high supply value of 2.0 volts. As pointed out previously herein, and as illustrated by FIG. 4, the invention advantageously includes both the first and second bias signals, to advantageously limit spread in oscillation frequency of the oscillator in relation to power supply variability. Similarly, the first and second bias signals also advantageously limit spread in amplitude of the oscillator in relation to small power supply variability, such as power supply noise.

As discussed, the present invention provides an oscillator with substantially symmetric rise and fall time, while limiting spread in oscillation frequency and spread in amplitude in relation to fabrication process variability and power supply variability. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefor, the invention may be practiced otherwise than as specifically described and illustrated.

What is claimed is:

1. An oscillator comprising:

a closed ring of interconnected elements, each including:

a differential pair of transistors having inverting and non-inverting types of delay inputs and outputs, a pair of current source inputs, and a pair of load inputs;

first and second signal controlled current sources each coupled with a respective one of the current source inputs; and first and second continuously variable signal controlled loads each coupled with a respective one of the load inputs;

wherein the first load is adapted for receiving a control signal and a bias signal.

2. An oscillator as in claim 1 wherein the second load is also adapted for receiving the control signal and the bias signal.

3. An oscillator comprising:

a closed ring of interconnected elements, each including:

a differential pair of transistors having inverting and non-inverting types of delay inputs and outputs, a pair of current source inputs, and a pair of load inputs;

first and second signal controlled current sources each coupled with a respective one of the current source inputs; and first and second signal controlled active loads each coupled with a respective one of the load inputs, wherein the first signal controlled active load comprises a pair of drain coupled transistors, wherein one member of the pair has a gate coupled with a control signal, and the other member of the pair has a gate coupled with a bias signal.

4. An oscillator comprising:

a closed ring of interconnected elements, each including:

a differential pair of transistors having inverting and non-inverting types of delay inputs and outputs, a pair of current source inputs, and a pair of load inputs;

first and second signal controlled current sources each coupled with a respective one of the current source inputs; and first and second signal controlled active loads each coupled with a respective one of the load inputs, wherein the second signal controlled active load comprises another pair of drain coupled transistors, wherein one member of the pair has a gate coupled with a control signal, and the other member of the pair has a gate coupled with a bias signal.

5. A method comprising the steps of:

providing a plurality of active delay elements interconnected in a closed ring arrangement so as to provide a ring oscillator, wherein each delay element includes a respective pair of signal controlled current sources adapted for receiving a first control signal and includes a respective pair of signal controlled loads adapted for receiving a second control signal;

coarsely adjusting the current sources and the loads by coarsely adjusting both the first and second control signals together so as to control oscillation frequency of the oscillator; and finely adjusting the current sources and the loads by finely adjusting the first and second control signals in relation to each other so as to control symmetry of rise and fall times of oscillation of the oscillator.

6. A method as in claim 5 wherein each delay element is adapted for receiving a pair of bias signals, and further comprising the steps of:

adjusting one of the bias signals; and adjusting another one of the bias signals in relation to the one bias signal so as to compensate for manufacturing process variability of the oscillator.

7. A method as in claim 6 further comprising the step of:

adjusting the one of the bias signals in relation to the other one of the bias signals so as to compensate for variability in a power supply of the oscillator.

* * * * *